United States Patent
Ng et al.

(10) Patent No.: US 9,441,792 B2
(45) Date of Patent: Sep. 13, 2016

(54) TRANSFER CHAMBER GAS PURGE APPARATUS, ELECTRONIC DEVICE PROCESSING SYSTEMS, AND PURGE METHODS

(71) Applicant: Applied Materials, Inc., Santa Clara, CA (US)

(72) Inventors: Edward Ng, San Jose, CA (US); Eric A. Englhardt, Palo Alto, CA (US); Travis Morey, Austin, TX (US); Ayan Majumdar, San Jose, CA (US); Steve S. Hongkham, San Ramon, CA (US)

(73) Assignee: Applied Materials, Inc., Santa Clara, CA (US)

( * ) Notice: Subject to any disclaimer, the term of this patent is extended or adjusted under 35 U.S.C. 154(b) by 15 days.

(21) Appl. No.: 14/498,449

(22) Filed: Sep. 26, 2014

(65) Prior Publication Data
US 2015/0090341 A1    Apr. 2, 2015

Related U.S. Application Data

(60) Provisional application No. 61/884,637, filed on Sep. 30, 2013.

(51) Int. Cl.
*H01L 21/67* (2006.01)
*F17D 1/04* (2006.01)

(52) U.S. Cl.
CPC ............ *F17D 1/04* (2013.01); *H01L 21/67196* (2013.01); *Y10T 137/0318* (2015.04); *Y10T 137/86292* (2015.04)

(58) Field of Classification Search
CPC ................................................. H01L 21/67196
See application file for complete search history.

(56) References Cited

U.S. PATENT DOCUMENTS

| 4,540,326 | A | * | 9/1985 | Southworth | ...... H01L 21/67709 104/138.1 |
|---|---|---|---|---|---|
| 5,211,733 | A | * | 5/1993 | Fukao | .................. C03B 19/103 432/97 |
| 5,407,350 | A | * | 4/1995 | Iwabuchi | ................ C23C 16/54 432/11 |
| 5,433,780 | A | * | 7/1995 | Ikeda | .................... C23C 14/564 118/50 |
| 5,789,878 | A | | 8/1998 | Kroeker et al. | |

(Continued)

FOREIGN PATENT DOCUMENTS

| KR | 10-2006-0135447 | 12/2006 |
|---|---|---|
| KR | 10-2007-0026986 | 3/2007 |
| KR | 10-0807031 B1 | 2/2008 |

OTHER PUBLICATIONS

Rice et al., U.S. Appl. No. 14/495,402, titled: "Mixed-Platform Apparatus, Systems, and Methods for Substrate Processing," filed Sep. 24, 2014.

(Continued)

*Primary Examiner* — Evan Pert
(74) *Attorney, Agent, or Firm* — Dugan & Dugan, PC

(57) ABSTRACT

Transfer chamber gas purge apparatus are disclosed. The transfer chamber gas purge apparatus has a transfer chamber adapted to contain at least a portion of a transfer robot, the transfer chamber including side walls, a chamber lid, and a chamber floor, wherein the chamber lid has a plurality of distributed chamber inlets. The plurality of distributed chamber inlets may include diffusing elements. Laminar purge gas flow may be provided above the substrate. Systems and methods including a plurality of distributed chamber inlets are disclosed, as are numerous other aspects.

18 Claims, 8 Drawing Sheets

(56) References Cited

U.S. PATENT DOCUMENTS

| | | | |
|---|---|---|---|
| 5,879,127 | A | 3/1999 | Grunes et al. |
| 5,951,770 | A | 9/1999 | Perlov et al. |
| 6,267,549 | B1 | 7/2001 | Brown et al. |
| 6,287,386 | B1 | 9/2001 | Perlov et al. |
| 6,379,095 | B1 | 4/2002 | Elliott et al. |
| 6,468,353 | B1 | 10/2002 | Perlov et al. |
| 6,575,737 | B1 | 6/2003 | Perlov et al. |
| 6,582,175 | B2 | 6/2003 | Cox et al. |
| 6,722,834 | B1 | 4/2004 | Tepman |
| 6,916,397 | B2 | 7/2005 | Pfeiffer et al. |
| 6,996,453 | B2 | 2/2006 | Ahn et al. |
| 7,720,655 | B2 | 5/2010 | Rice |
| 2005/0072716 | A1 | 4/2005 | Quiles et al. |
| 2006/0065194 | A1 | 3/2006 | Ham |
| 2009/0108544 | A1 | 4/2009 | Sico et al. |
| 2010/0178146 | A1 | 7/2010 | Kremerman et al. |
| 2010/0178147 | A1 | 7/2010 | Kremerman et al. |
| 2013/0039726 | A1 | 2/2013 | Brodine et al. |
| 2013/0115028 | A1 | 5/2013 | Kremerman et al. |
| 2013/0149076 | A1 | 6/2013 | Cox et al. |
| 2014/0262036 | A1 | 9/2014 | Reuter et al. |
| 2014/0263165 | A1 | 9/2014 | Hongkham et al. |
| 2014/0273487 | A1 | 9/2014 | Deshmukh et al. |

OTHER PUBLICATIONS

Perlov et al., U.S. Appl. No. 10/193,605, titled: "Method and Apparatus for Improved Substrate Handling", filed Jul. 11, 2002.
Quiles et al, U.S. Appl. No. 14/335,415, titled: "Substrate Processing System, Valve Assembly, and Processing Method," filed Jul. 18, 2014.
Parkhe et al., U.S. Appl. No. 14/085,026, titled: "Electrostatic Chuck With Variable Pixilated Heating," filed Nov. 20, 2013.
Madiwal et al., U.S. Appl. No. 14/036,754, titled: "Gas Apparatus, Systems, and Methods for Chamber Ports," filed Sep. 25, 2013.
Koshti et al., U.S. Appl. No. 14/456,631, titled: "Substrate Processing Systems, Apparatus, and Methods With Factory Interface Environmental Controls," filed Aug. 11, 2014.
Busche et al., U.S. Appl. No. 14/299,850, titled: "Substrate Temperature Control Apparatus Including Optical Fiber Heating, Substrate Temperature Control Systems, Electronic Device Processing Systems, and Methods," filed Jun. 9, 2014.
International Search Report and Written Opinion of International Application No. PCT/US2014/057753 mailed Jan. 7, 2015.
International Preliminary Report on Patentability of International Application No. PCT/US2014/057753 mailed Apr. 14, 2016.

\* cited by examiner

TRANSFER CHAMBER GAS PURGE APPARATUS, ELECTRONIC DEVICE PROCESSING SYSTEMS, AND PURGE METHODS

RELATED APPLICATION

The present application claims priority to U.S. Provisional Application No. 61/884,637 filed on Sep. 30, 2013, and entitled "TRANSFER CHAMBER GAS PURGE APPARATUS, SYSTEMS, AND METHODS", which is hereby incorporated by reference herein for all purposes.

FIELD

The present invention relates to electronic device manufacturing, and more specifically to transfer chamber gas supply apparatus, systems, and methods thereof.

BACKGROUND

Conventional electronic device manufacturing systems may include one or more process chambers that are adapted to carry out any number of processes, such as degassing, cleaning or pre-cleaning, deposition such as chemical vapor deposition (CVD), physical vapor deposition (PVD), or atomic layer deposition, coating, oxidation, nitration, etching (e.g., plasma etch), or the like. One or more load lock chambers may be provided to enable entry and exit of substrates from a factory interface. Each of these process chambers and load lock chambers may be included in a cluster tool, where a plurality of process chambers may be distributed about a transfer chamber, for example. A transfer robot may be housed within the transfer chamber to transport substrates to and from the various process chambers and load locks on one or more end effectors. Conventionally, a slit valve opening is provided between the transfer chamber and each process chamber and load lock chamber. One or more end effectors (e.g., blades) of the transfer robot may pass through the slit valve opening to place or extract a substrate (e.g., a silicon wafer, glass plate, or the like) into or from a support (e.g., a pedestal or lift pins) provided within the process chamber or load lock chamber.

Once the substrate is properly disposed within the process chamber, the slit valve may be closed, and the processing of the substrate may commence. As part of the processing, particles may be formed due to moving components in the system. If such particulates come to rest on the processed substrates, this may impact the quality of the substrate. To minimize particulates, prior systems have included a gas inlet into the transfer chamber underneath the robot as well as a gas exit out of the transfer chamber, also under the robot to accomplish purge of the transfer chamber. However, such systems have been generally ineffective.

Accordingly, improved transfer chamber gas flow apparatus, systems, and methods are desired.

SUMMARY

In one embodiment, a transfer chamber gas purge apparatus is provided. The transfer chamber gas purge apparatus includes a transfer chamber adapted to contain at least a portion of a transfer robot, the transfer chamber at least partially formed by side walls, a chamber lid, and a chamber floor, the chamber lid having a plurality of distributed chamber inlets.

In another aspect, an electronic device processing system is provided. The electronic device processing system includes a transfer chamber at least partially formed by a mainframe housing having side walls, a chamber lid, and a chamber floor, a plurality of distributed chamber inlets in the chamber lid, and a plurality of distributed chamber outlets in the chamber floor.

In another aspect, a method of purging a transfer chamber is provided. The method includes providing a transfer chamber at least partially formed by a chamber lid, side walls, and a chamber floor, the transfer chamber containing at least a portion of a robot adapted to transport a substrate to and from chambers accessed from the transfer chamber; and purging from the transfer chamber by inflow of a purge gas through a plurality of distributed inlets in the chamber lid.

Numerous other features are provided in accordance with these and other aspects of the invention. Other features and aspects of embodiments of the present invention will become more fully apparent from the following detailed description, the appended claims and the accompanying drawings.

DESCRIPTION

Existing electronic device manufacturing systems have used purge within a transfer chamber in an attempt to control particulates. In particular, prior art purge systems have included an inlet and an outlet in a floor of the transfer chamber. Although some improvement is provided by this type of transfer chamber purge, additional measures to control particulates are desired in order to further improve system/tool yield.

To order to address this problem, embodiments of the present invention provide improved transfer chamber gas purge apparatus, systems, and methods. In one aspect, an improved transfer chamber gas purge apparatus is provided. The transfer chamber gas purge apparatus is useful for purging a transfer chamber adapted to contain at least a portion of a transfer robot which is adapted to carry one or more substrates. The transfer chamber includes side walls, a chamber lid, and a chamber floor. The chamber lid has a plurality of distributed chamber inlets therein.

In one or more embodiments, some or all of the plurality of distributed chamber inlets may include diffusing members adapted and functional to diffuse inlet purge gas flow. Furthermore, a plurality of distributed chamber outlets may be including in the chamber floor. In further embodiments, the plurality of distributed chamber inlets may include primary chamber inlets and secondary inlets. Such primary chamber inlets and secondary inlets may be independently controllable in some embodiments. Thus, improved transfer chamber purge is provided, especially in an area of the transfer chamber where the substrate(s) are positioned when being transferred through the transfer chamber. In some embodiments, laminar purge gas flow is provided above the substrate(s).

In another aspect, an electronic device processing system is provided. The electronic device processing system includes a transfer chamber adapted to contain at least a portion of a robot carrying a substrate, wherein the transfer chamber includes a chamber lid, side walls, and a chamber floor, a plurality of distributed chamber inlets provided in the chamber lid, and a plurality of distributed chamber outlets included the chamber floor.

Further details of example embodiments illustrating and describing various aspects of the invention, including apparatus, systems, and method aspects, are described with reference to FIGS. 1A-6 herein.

Figure 1A:
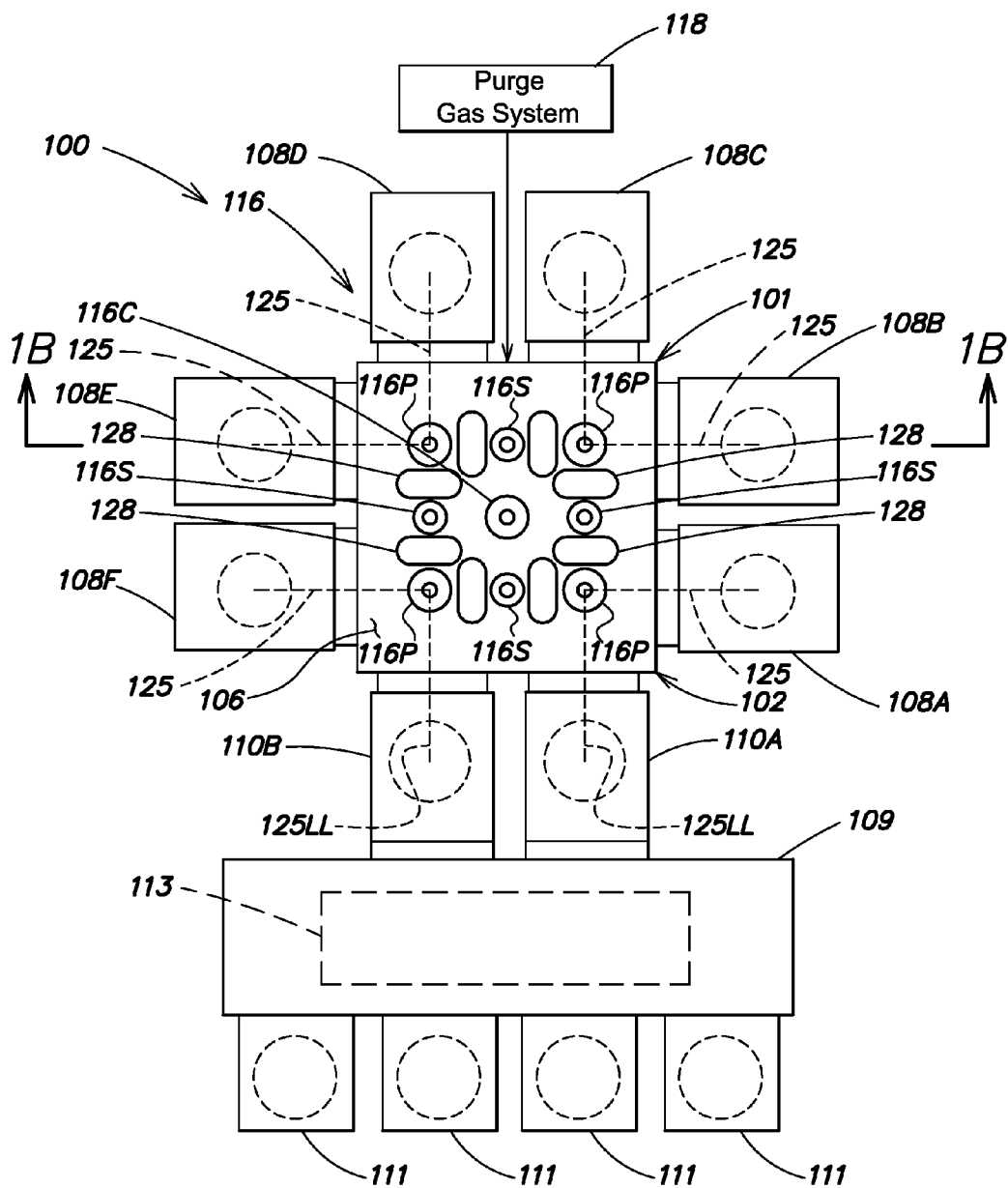
FIG. 1A illustrates a schematic top view of an electronic device processing system including a transfer chamber gas purge apparatus according to embodiments.
Figure 1B:
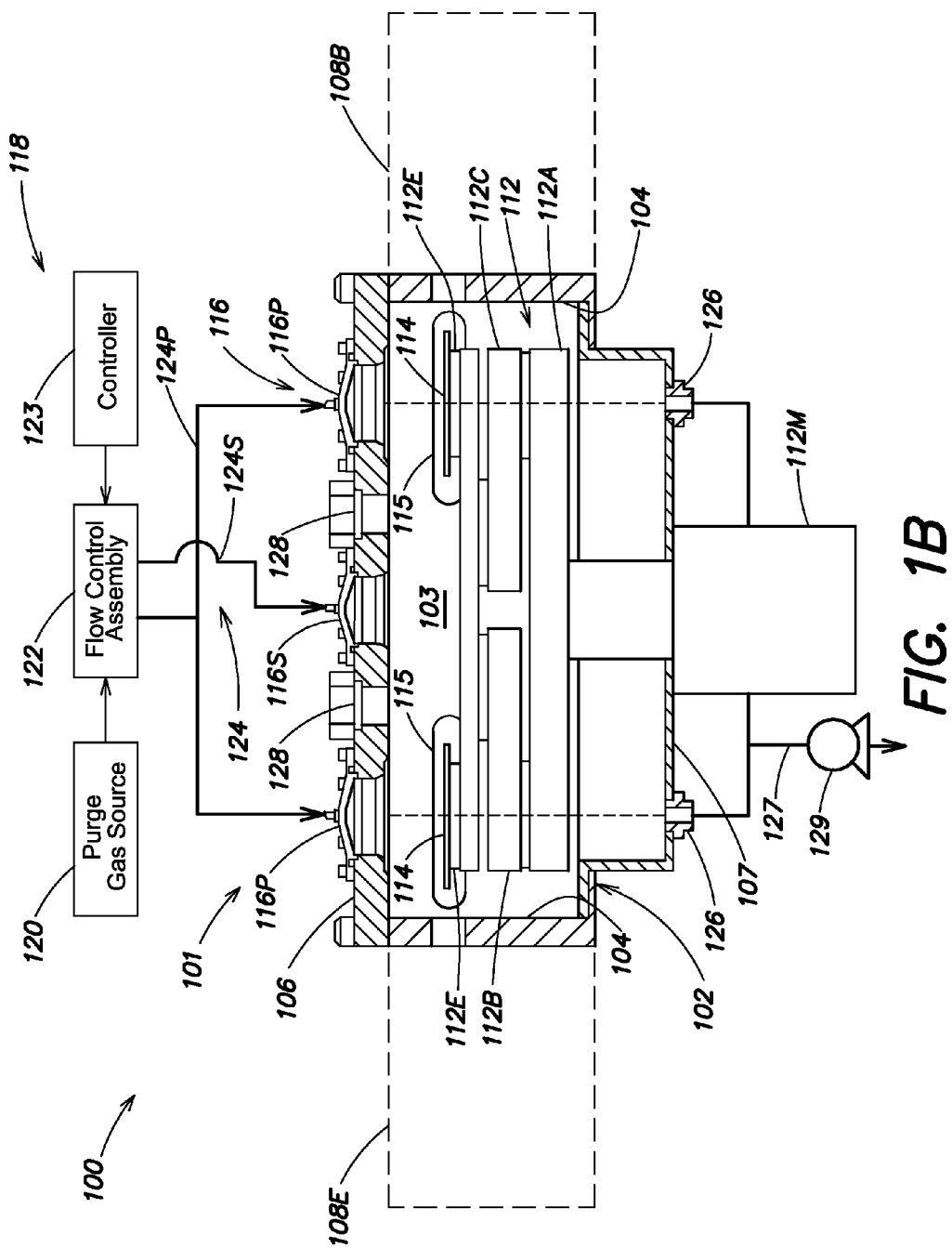
FIG. 1B illustrates a cross-sectioned partial side view of an electronic device processing system including a transfer chamber gas purge apparatus according to embodiments.

FIGS. 1A and 1B illustrates a top schematic view and a cross-sectional side view, respectively, of an example embodiment of an electronic device processing system 100 including a transfer chamber gas purge apparatus 101. The electronic device processing system 100 may be adapted to process substrates (e.g., silicon-containing wafers, plates, discs, or the like) by imparting one or more processes thereto, such as degassing, cleaning or pre-cleaning, deposition such as chemical vapor deposition (CVD), physical vapor deposition (PVD), or atomic layer deposition (ALD), coating, oxidation, nitration, etching (e.g., plasma etch), or the like. Other processes may be carried out by the electronic device processing system 100.

The depicted electronic device processing system 100 includes a mainframe housing 102 including a transfer chamber 103 formed at least by side walls 104, a chamber lid 106, and chamber floor 107 thereof. A plurality of process chambers 108A-108F and one or more load lock chambers 110A, 110B may be mechanically coupled to the mainframe housing 102. Other numbers of process chambers and load lock chambers may be included. The transfer chamber 103 includes a robot 112 that is configured and adapted to transfer one or more substrates 114 to and from at least two chambers that are coupled to the mainframe housing 102. The at least two chambers are accessible by the robot 112, and at least a part of the robot 112 resides in the transfer chamber 103. As used herein, a "transfer chamber" contains at least a portion of a robot 112 (e.g., moving arms and an attached end effector 112E) that is adapted to transport one or more substrates 114 to and from chambers (e.g., process chambers 108A-108F) accessed from the transfer chamber 103. The electronic device processing system 100 may also include a factory interface 109 having one or more substrate carriers 111 docked thereto. Substrate carriers 111 are adapted to carry one or more substrates 114 within the manufacturing environments (e.g., between tools). A factory interface robot 113 (shown as a dotted box) may be included in the factory interface 109 in one or more embodiment, and may function to transfer substrates 114 between the substrate carriers 111 and the one or more load lock chambers 110A, 110B.

In the depicted embodiment, the robot 112 may include arms 112A, 112B, 112C inside of the transfer chamber 103, one or more robot motors 112M, which may be outside of the transfer chamber 103, and one or more end effectors 112E upon which substrates 114 may rest and be transported. End effectors 112E may be rigidly coupled together or may be independently actuated. Robot 112 may be of any suitable construction, such as described in U.S. Pat. Nos. 5,789,878; 5,879,127; 6,267,549; 6,379,095; 6,582,175; and 6,722,834; and US Pat. Pub. Nos. 2010/0178147; 2013/0039726; 2013/0149076; 2013/0115028; and 2010/0178146, for example. Other suitable robots may be used.

Robot 112 is operable to transport substrates 114 to and from the process chambers 108A-108F and to and from the one or more load lock chambers 110A, 110B. In each case, the transfer is through an opening 115 (e.g., slit valve opening) formed in the mainframe housing 102, generally a slit-shaped opening, which may have a slit valve door (not shown) operable therewith to seal the respective chambers after the substrate 114 has been placed therein by the robot 112. In the depicted embodiment, twinned, that is side-by-side chambers are provided. However, it should be understood that the transfer chamber gas purge apparatus 101 may be used with other transfer chamber configurations, such as those including radially-accessed process chambers included in heptagonal, hexagonal, or octagonal mainframe housings, or the like. Other shapes of the transfer chamber 103 may be used.

As previously discussed, the transfer chamber gas purge apparatus 101 includes the transfer chamber 103 adapted to contain at least a portion of the robot 112, the transfer chamber 103 being at least partially formed by the interconnection of side walls 104, a chamber lid 106, and a chamber floor 107. In the depicted embodiment, the chamber lid 106 has a plurality of distributed chamber inlets 116 therein, which may include primary chamber inlets 116P and secondary chamber inlets 116S. Chamber inlets 116 are coupled to a purge gas supply assembly 118. Purge gas supply assembly 118 may include a purge gas source 120, such as a pressurized gas-containing vessel, a flow control assembly 122, which may comprise one or more valves or mass flow controllers adapted to control purge gas flow, and a controller 123.

The purge gas supply assembly 118 may also include an intake manifold 124, which may be a collection of gas flow pathways (e.g., conduits) that are coupled between the flow control assembly 122 and the plurality of chamber inlets 116. Intake manifold 124 may include primary pathways 124P and secondary pathways 124S. Purge gas flow through the primary pathways 124P and secondary pathways 124S may fluidly couple to the primary and secondary chamber inlets 116P, 116S, so that purge gas flow to the primary chamber inlets 116P and secondary chamber inlets 116S may be independently controllable by the flow control assembly 122. Purge gas may comprise an inert gas, such as $N_2$. Other suitable purge gases may be used. In some embodiments, the transfer chamber 103 may be maintained at a vacuum, for example.

Chamber lid 106 may be at the top of the transfer chamber 103 and located generally above the level of the end effectors 112E and supported substrates 114. Chamber lid 106 may be removable and may connectable to the side walls 104 in some embodiments.

In the depicted embodiment, the plurality of distributed chamber inlets 116 on the chamber lid 106 comprises at least four primary chamber inlets 116P located in the transfer chamber 103. At least some of the primary chamber inlets 116P may be positioned above a transfer path of the substrate 114 as it exits the respective process chamber 108A-108F. For example, one or more of the primary chamber inlets 116P may be positioned above transfer paths 125. In this manner, purge gas may flow downwardly and over the substrate 114, blanketing the substrate 114 with purge gas flow as the substrate 114 exits the respective process chambers 108A-108F.

Similarly, primary chamber inlets 116P may be positioned above load lock transfer paths 125LL of the one or more substrates 114 as they enter into the transfer chamber 103 from the load lock chambers 110A, 110B. In twinned transfer chamber configuration shown in FIGS. 1A and 1B, positioning of the plurality of distributed chamber inlets 116 may serve to provide improved purge gas flow as the substrates 114 exit from the process chambers 108A-108F.

The plurality of distributed chamber inlets 116 of the transfer chamber gas purge apparatus 101 may include at least four secondary chamber inlets 116S. At least some of the secondary chamber inlets 116S may be arranged between respective ones of the primary chamber inlets 116P. For example, the secondary chamber inlets 116S may be arranged to purge the transfer chamber volume located between the openings 115, or between the openings to the load lock chambers 110A, 110B. An optional primary or secondary inlet 116C may be provided at or near a physical center of the transfer chamber 103, as shown. In some embodiment, a plurality of view windows 128 (a few labeled) may be formed in the chamber lid 106. View windows 128 may include clear or translucent panels, such as glass panels and may allow the robot 112 and components thereof as well as the substrates 114 to be viewed within the transfer chamber 103. View windows 128 may be arranged between the respective primary and secondary chamber inlets 116P, 116S.

In one or more embodiments, the transfer chamber gas purge apparatus 101 may include a plurality of chamber outlets 126. Plurality of chamber outlets 126 may exit from the chamber floor 107. However, the plurality of chamber outlets may exit from the side walls 104 (e.g., at the bottom of the side walls 104) in some embodiments. In the depicted embodiment, the plurality of chamber outlets 126 exit from the chamber floor 107 of the transfer chamber 103 at a location below the substrates 114. The plurality of chamber outlets 126 may couple to an exhaust manifold 127 that is adapted to flow the purge gas exiting the transfer chamber 103 to an exhaust system, such as a factory exhaust. Exhaust manifold 127 may be arranged around the robot motor 112M. One or more vacuum sources 129, such as vacuum turbo pumps, may be coupled to the exhaust manifold 127 to provide a desired level of vacuum in the transfer chamber 103 during the purge process in some embodiments. In some embodiments, the location of one or more of the plurality of chamber outlets 126 may be positioned vertically in line with one or more of the plurality of chamber inlets 116 (e.g., see dotted vertical line in FIG. 1B connecting primary chamber inlets 116P and the chamber outlets 126). For example, in the depicted embodiment, four chamber inlets 116P lie directly vertically above four chamber outlets 126. In other embodiments, at least some of the plurality of chamber outlets 126 may be positioned radially in line (lie along a same radius) with one or more of the plurality of chamber inlets 116.

Figure 2:
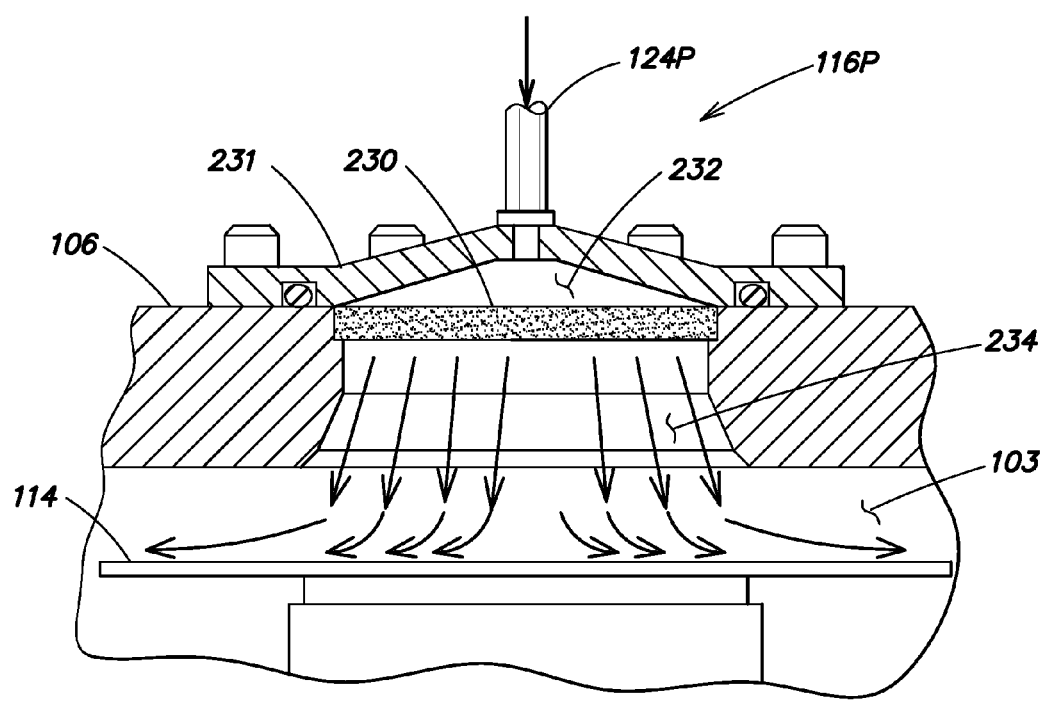
FIG. 2 illustrates a cross-sectioned partial side view of a chamber inlet including a diffusing element according to embodiments.

In the depicted embodiments, at least some, and preferably all, of the chamber inlets 116 (e.g., chamber inlets 116P, 116S, 116C shown) may include a diffusing element 230. An example chamber inlet 116P including a diffusing element 230 is shown in FIG. 2. The diffusing element 230 may comprise a porous member having an enlarged frontal surface area as compared to a cross-sectional area of the primary pathway 124P of the intake manifold 124 that is coupled to the chamber inlet 116P. In the depicted embodiment, the diffusing element 230 may comprise a porous metal disc. Chamber inlet 116P may include an inlet body 231 at least partially forming a diffusing chamber 232 that receives a purge gas from the primary pathway 124P of the intake manifold 124 and enlarges in cross-sectional area to pass the purge gas through an enlarged entry area on an entry side of the diffusing element 230. Purge gas then passes through the diffusing element 230 (e.g., through open pores thereof) and may pass into an expansion zone 234 which may be formed in the chamber lid 106 and located downstream of the diffusing element 230. Within the expansion zone 234, the purge gas flow transitions into the transfer chamber 103. Expansion zone 234 may include one or more frusto-conical sections or a radius, for example. In the depicted example, the expansion zone 234 includes interconnected frustocone sections having different cone angles. Other area-enlarging transition zone structures may be used.

In one or more embodiments, the plurality of distributed chamber inlets 116 may include primary chamber inlets 116P and secondary chamber inlets 116S having different inlet flow areas at their respective entrances into the transfer chamber 103 (See FIG. 1B). In particular, the area of the primary chamber inlets 116P may be larger than the area of the secondary chamber inlets 116S in some embodiments. For example, the area of each of the primary chamber inlets 116P and the secondary chamber inlets 116S may be between about 10 cm$^2$ and between about 100 cm$^2$. However, other sizes may be used. Furthermore, in some embodiments, the secondary chamber inlets 116S may be equal in size to the primary chamber inlets 116P.

As is conventional, substrates 114 may be provided to, and withdrawn from, the process chambers 108A-108F through openings 115 (e.g., slit valve openings). A general level of vacuum may be provided in the transfer chamber 103 by an operation of one or more vacuum sources 129 (e.g., one or more turbo pumps) connected below the chamber outlets 126.

Operation of the transfer chamber gas purge apparatus 101 may be adjusted via control signals to the flow control assembly 122 from a controller 123 to provide a laminar gas flow pattern above the substrate 114. Gas flow adjustments may be made by adjusting the overall flow rate of the purge gas from the purge gas source 120 to the plurality of chamber inlets 116. In particular, purge gas flow adjustments may be made by adjusting the flow control assembly 122. Flow control assembly 122 may comprise one or more valves, mass flow controllers (MFC's), or other suitable gas flow adjusters. In particular, purge gas flow provided to the primary and secondary chamber inlets 116P, 116S may be independently controlled by controlling flow control members (valves, MFC's or the like) of the flow control assembly 122, for example.

Figure 3:
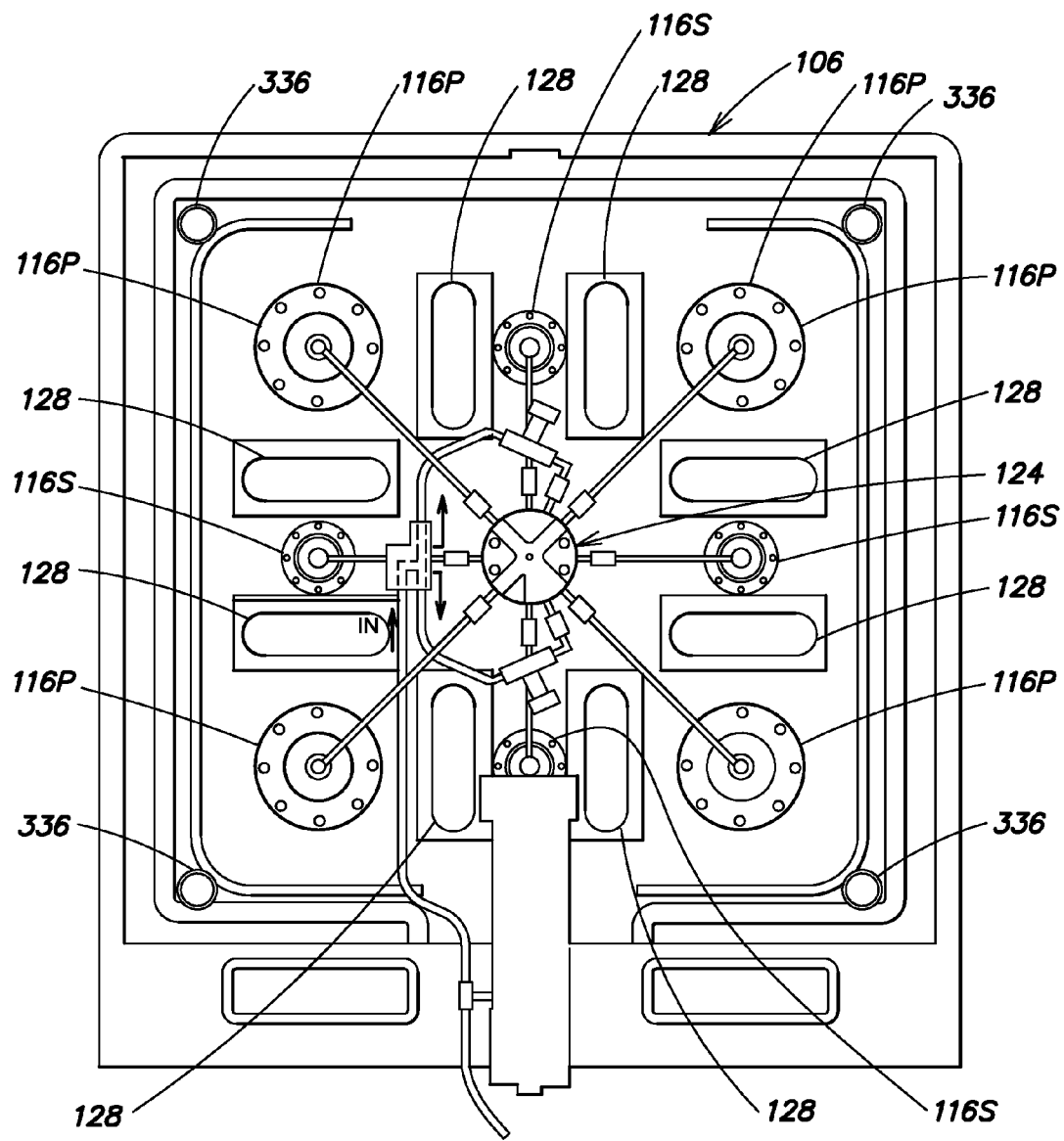
FIG. 3 illustrates a top view of a chamber lid of a transfer chamber gas purge apparatus according to embodiments.

FIG. 3 illustrates a top view of an example of a chamber lid 106 including an intake manifold 124 and flow control assembly 122 coupled thereto. Chamber lid 106 may be removable from the mainframe housing 102 and secured thereto by fasteners. Sealing between the bottom of the chamber lid 106 and the mainframe housing 102 may be provided by suitable O-ring or other sealing member. In some embodiments, the chamber lid 106 may be pivotal and lifted by lift pins 336.

Figure 4A:
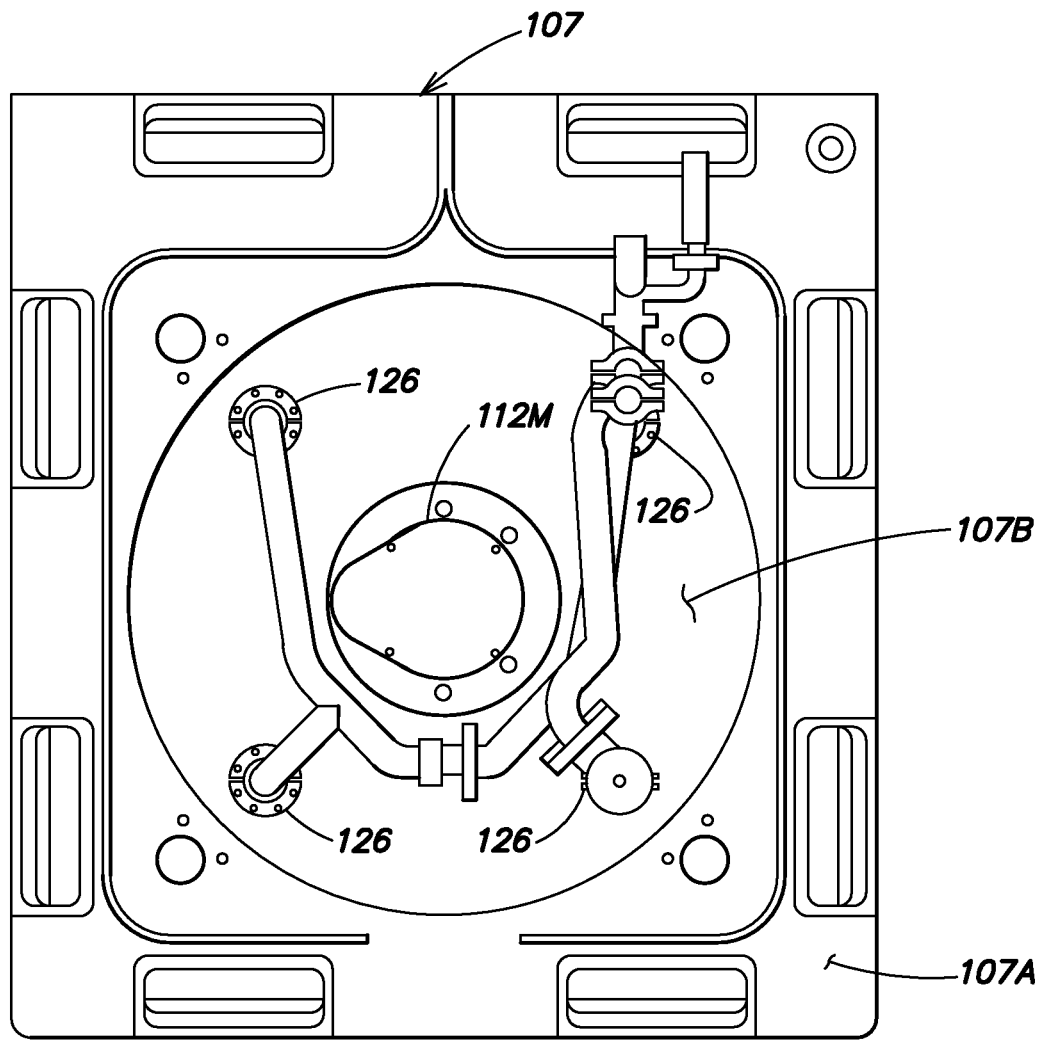
FIG. 4A is a bottom plan view of an exhaust assembly of a transfer chamber gas purge apparatus according to embodiments.
Figure 4B:
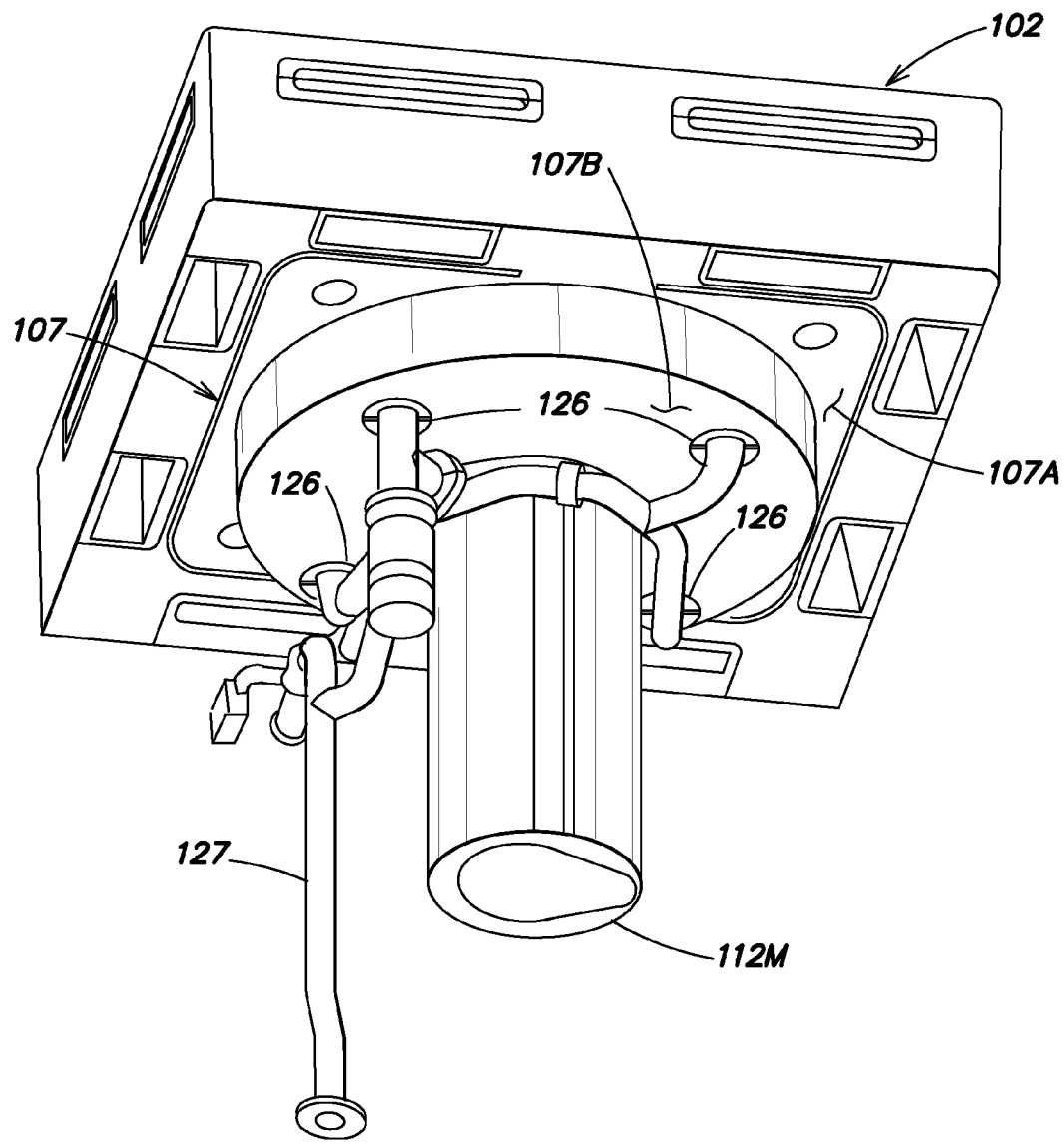
FIG. 4B is a perspective bottom view of an exhaust assembly of a transfer chamber gas purge apparatus according to embodiments.

FIGS. 4A and 4B illustrate an example embodiment of a chamber floor 107 and portions of the transfer chamber gas purge apparatus 101 that are connected thereto. Chamber floor 107, in the depicted embodiment, includes a first portion 107A and a second portion 107B coupled to the first portion 107A. First portion 107A is configured and adapted to couple to the bottom of the mainframe housing 102. Exhaust manifold 127 is shown coupled to the respective chamber outlets 126, which are included in the second portion 107B of the chamber floor 107.

Figure 5:
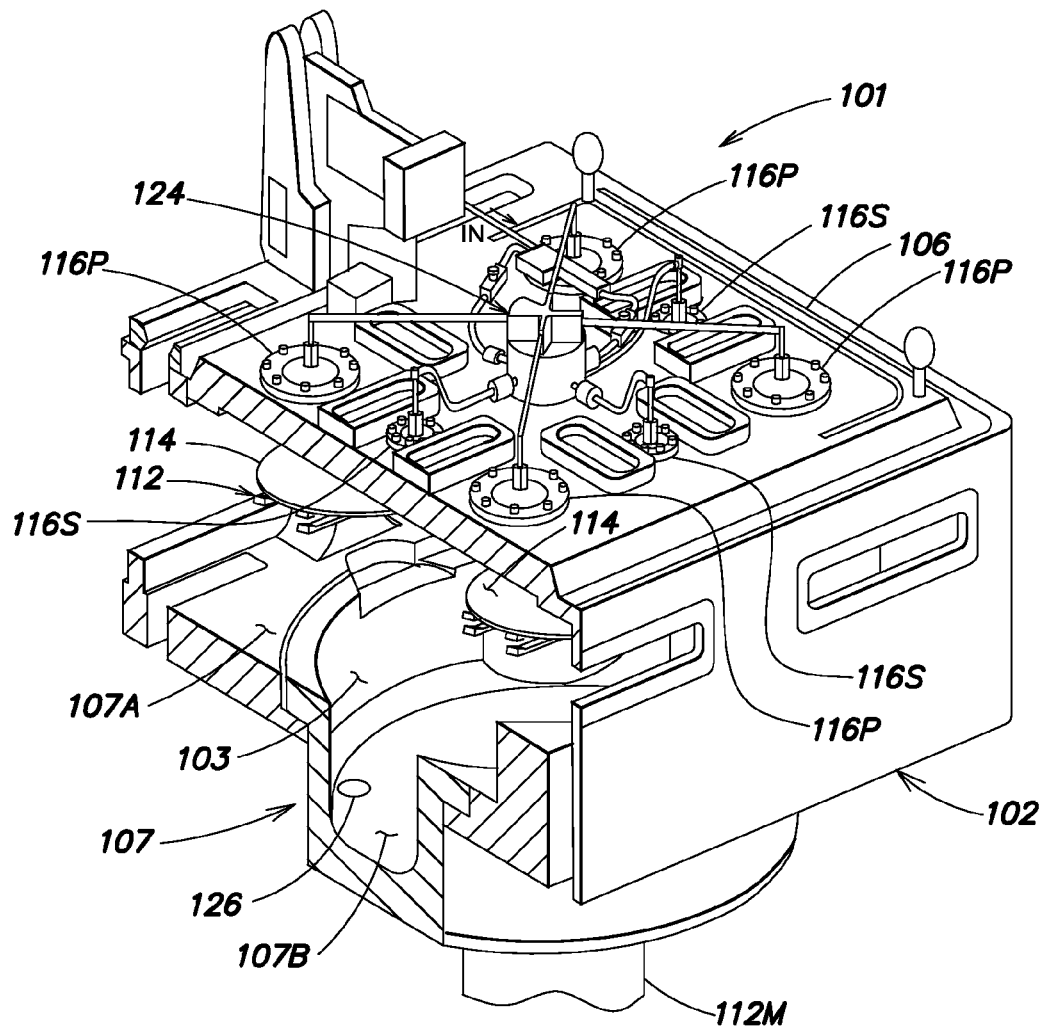
FIG. 5 illustrates a partial cross-sectioned perspective view of a transfer chamber gas purge apparatus according to embodiments.

FIG. 5 illustrates a partially cross-sectioned perspective view of an embodiment of transfer chamber gas purge apparatus 101. Transfer chamber gas purge apparatus 101 includes a chamber lid 106 with the plurality of chamber inlets 116 providing purge gas to the transfer chamber 103, and a chamber floor 107 with a plurality of chamber outlets 126 (only one shown in FIG. 5) adapted to exhaust purge gas from the transfer chamber 103. The chamber inlets 116 may provide gas purge flow entering the transfer chamber 103 above the substrates 114. Purge gas flow may be laminar between the substrates 114 and the chamber lid 106.

Figure 6:
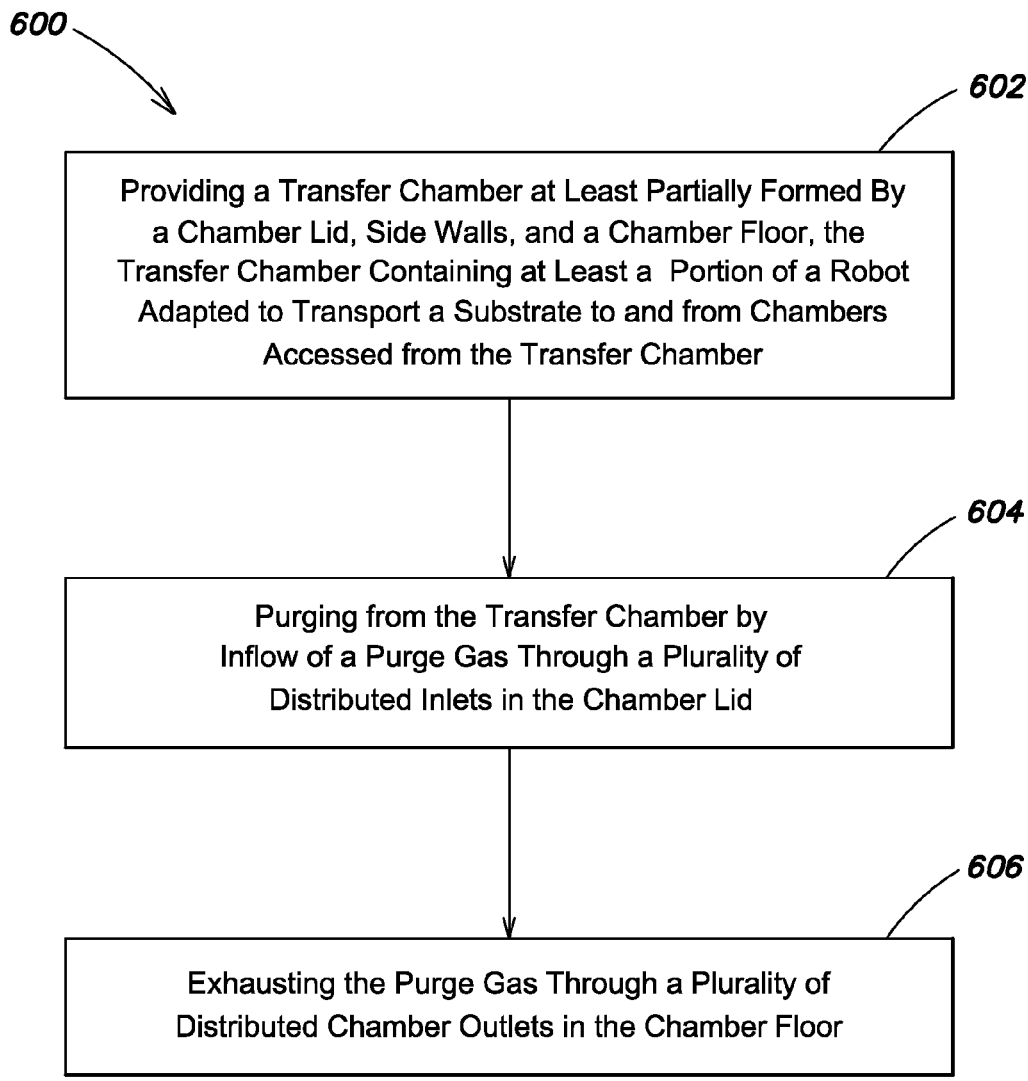
FIG. 6 a flowchart depicting a method of purging a transfer chamber according to embodiments.

A method 600 of purging a transfer chamber (e.g., transfer chamber 103) according to one or more embodiments of the present invention is provided and described with reference to FIG. 6. The method 600 includes, in 602, providing a transfer chamber (e.g., transfer chamber 103) at least partially formed by a chamber lid (e.g., chamber lid 106), side walls (e.g., side walls 104), and a chamber floor (e.g., 107), the transfer chamber containing at least a portion of a robot (e.g., robot 112) adapted to transport a substrate (e.g., substrate 114) to and from chambers (e.g., any one or more process chambers 108A-108F or load lock chambers 110A, 110B) accessed from the transfer chamber.

The method 600 includes, in 604, purging from the transfer chamber (e.g., transfer chamber 103) by inflow of a purge gas through a plurality of distributed inlets (e.g., plurality of distributed chamber inlets 116) in the chamber lid (e.g., chamber lid 106).

In one or more embodiments, the purging may further comprise, in 606, exhausting the purge gas through a plurality of distributed chamber outlets (e.g., plurality of distributed chamber outlets 126) provided in the chamber floor (e.g., chamber floor 107). In some embodiments, the purging from the transfer chamber may further comprise inflow of the purge gas through a plurality of diffusing elements (e.g., diffusing elements 230). The purging from the transfer chamber 103 may further comprise providing a substantially laminar flow of the purge gas above the substrate 114 in some embodiments. Purge gas flow conditions to achieve substantially laminar purge gas flow above the substrate 114 may be attained by adjusting the flow control assembly 122 fluidly coupled to the plurality of chamber inlets 116 in the chamber lid 106. Purge gas flow may be additionally controlled by providing the plurality of distributed chamber inlets 116 with primary chamber inlets (e.g., primary chamber inlets 116P) and secondary chamber inlets (e.g., secondary chamber inlets 116S), and independently controlling flow of the purge gas to the primary chamber inlets 116P and the secondary chamber inlets 116S. For example, relatively more purge gas flow may be provided to the primary chamber inlets (e.g., primary inlets 116P) and relatively less flow may be provided to the secondary chamber inlets (e.g., secondary chamber inlets 116S). Further, purge gas flow adjustments may be made in some embodiments to equalize flow patterns within the transfer chamber (e.g., transfer chamber 103).

The foregoing description discloses only example embodiments of the invention. Modifications of the above-disclosed apparatus, systems, and methods which fall within the scope of the invention will be readily apparent to those of ordinary skill in the art. Accordingly, while the present invention has been disclosed in connection with example embodiments thereof, it should be understood that other embodiments may fall within the scope of the invention, as defined by the following claims.

The invention claimed is:

1. A transfer chamber gas purge apparatus, comprising:
a transfer chamber adapted to contain at least a portion of a transfer robot, the transfer chamber at least partially formed by side walls, a chamber lid, and a chamber floor, the chamber lid having a plurality of distributed chamber inlets including primary chamber inlets, at least some of which are positioned above a transfer path of a substrate, and secondary chamber inlets, at least some of which are arranged between the primary chamber inlets.

2. A transfer chamber gas purge apparatus, comprising:
a transfer chamber adapted to contain at least a portion of a transfer robot, the transfer chamber at least partially formed by side walls, a chamber lid, and a chamber floor, the chamber lid having a plurality of distributed chamber inlets
wherein the plurality of distributed chamber inlets comprise primary chamber inlets and secondary chamber inlets, wherein the primary chamber inlets and secondary chamber inlets are independently controllable.

3. The transfer chamber gas purge apparatus of claim 2, wherein the primary chamber inlets and the secondary chamber inlets are coupled to a flow control assembly.

4. The transfer chamber gas purge apparatus of claim 1, wherein the plurality of distributed chamber inlets comprises at least four primary chamber inlets.

5. The transfer chamber gas purge apparatus of claim 1, wherein the plurality of distributed chamber inlets comprises at least four secondary chamber inlets.

6. The transfer chamber gas purge apparatus of claim 1, comprising a plurality of view windows formed in the chamber lid.

7. The transfer chamber purge gas apparatus of claim 1, wherein at least some of the plurality of distributed chamber inlets comprise a diffusing element.

8. The transfer chamber purge gas apparatus of claim 7, wherein the diffusing element comprises a porous member.

9. The transfer chamber purge gas apparatus of claim 7, wherein the diffusing element comprises a porous metal disc.

10. A transfer chamber purge gas apparatus, comprising:
a transfer chamber adapted to contain at least a portion of a transfer robot, the transfer chamber at least partially formed by side walls, a chamber lid, and a chamber floor, the chamber lid having a plurality of distributed chamber inlets
wherein the plurality of distributed chamber inlets comprise primary chamber inlets and secondary chamber inlets having different inlet flow areas at their respective entrances into the transfer chamber.

11. The transfer chamber purge gas apparatus of claim 1, comprising a plurality of distributed chamber outlets provided in the chamber floor.

12. The transfer chamber purge gas apparatus of claim 1, comprising a plurality of distributed chamber outlets provided in the chamber floor, wherein at least some of the plurality of distributed chamber outlets are vertically aligned with at least some of the plurality of distributed chamber inlets.

13. An electronic device processing system, comprising:
a transfer chamber at least partially formed by a mainframe housing having side walls, a chamber lid, and a chamber floor;
a plurality of distributed chamber inlets in the chamber lid; and
a plurality of distributed chamber outlets in the chamber floor.

14. The electronic device processing system of claim 13, wherein the transfer chamber contains a robot adapted to transfer substrates to and from at least two chambers coupled to the mainframe housing.

15. A method of purging a transfer chamber, comprising:
providing a transfer chamber at least partially formed by a chamber lid, side walls, and a chamber floor, the transfer chamber containing at least a portion of a robot adapted to transport a substrate to and from chambers accessed from the transfer chamber; and
purging from the transfer chamber by inflow of a purge gas through a plurality of distributed inlets in the chamber lid wherein the purging from the transfer chamber further comprises providing a substantially laminar flow of the purge gas above the substrate.

16. The method of claim 15, wherein the purging further comprises exhausting the purge gas through a plurality of distributed chamber outlets in the floor.

17. The method of claim 15, wherein the purging from the transfer chamber further comprises inflow of the purge gas through a plurality of diffusing elements.

18. The method of claim 15, comprising:
providing the plurality of distributed chamber inlets with primary chamber inlets and secondary chamber inlets; and
independently controlling flow of the purge gas to the primary chamber inlets and the secondary chamber inlets.

* * * * *